(12) United States Patent
Zevenhoven et al.

(10) Patent No.: US 11,500,049 B2
(45) Date of Patent: Nov. 15, 2022

(54) PULSABLE SUPERCONDUCTING COIL SETUP FOR MAGNETICALLY SENSITIVE OPERATIONS

(71) Applicant: AALTO UNIVERSITY FOUNDATION SR, Aalto (FI)

(72) Inventors: Cornelis Zevenhoven, Aalto (FI); Iiro Lehto, Aalto (FI)

(73) Assignee: Aalto University Foundation SR, Aalto (FI)

( * ) Notice: Subject to any disclaimer, the term of this patent is extended or adjusted under 35 U.S.C. 154(b) by 0 days.

(21) Appl. No.: 17/272,060

(22) PCT Filed: Aug. 29, 2019

(86) PCT No.: PCT/FI2019/050614
§ 371 (c)(1),
(2) Date: Feb. 26, 2021

(87) PCT Pub. No.: WO2020/043951
PCT Pub. Date: Mar. 5, 2020

(65) Prior Publication Data
US 2021/0325492 A1     Oct. 21, 2021

(30) Foreign Application Priority Data
Aug. 29, 2018  (FI) ................................... 20185716

(51) Int. Cl.
*G01R 33/3815* (2006.01)
*G01R 33/34* (2006.01)
(Continued)

(52) U.S. Cl.
CPC ... *G01R 33/3815* (2013.01); *G01R 33/34023* (2013.01); *G01R 33/445* (2013.01); *G01R 33/56563* (2013.01); *H01F 6/06* (2013.01)

(58) Field of Classification Search
CPC .......... G01R 33/3815; G01R 33/34023; G01R 33/445; G01R 33/56563; H01F 6/06
See application file for complete search history.

(56) References Cited

U.S. PATENT DOCUMENTS

2014/0343397 A1\* 11/2014 Kim ........................ A61B 5/05
                                                                    600/409
2016/0209482 A1\* 7/2016 Hwang ................ G01R 33/326

OTHER PUBLICATIONS

Lehto, Master's Thesis, Title: Superconducting prepolarization coil for ultra-low-field MRI, Aalto University, Aalto, Finland (Year: 2017).\*

(Continued)

*Primary Examiner* — G. M. A Hyder
(74) *Attorney, Agent, or Firm* — Thomas | Horstemeyer, LLP

(57) ABSTRACT

The invention relates to a device for magnetic measurements and/or magnetic imaging such as an MRI device or a hybrid MEG-MRI device. The device comprises an array of one or more detectors for the magnetic signal and one or more coils for producing preparatory magnetic field pulses. The device further comprises means to drive current pulses through the said coils, wherein at least one of the coils comprises material that is Type-II superconducting at the operating temperature. The device is configured to cancel out at least part of the field generated by the remanent magnetization after a current pulse by the shape of the current pulse and/or the geometrically balanced design of the coil.

17 Claims, 4 Drawing Sheets

(51) Int. Cl.
　　　*G01R 33/44*　　　(2006.01)
　　　*G01R 33/565*　　(2006.01)
　　　*H01F 6/06*　　　(2006.01)

(56) References Cited

OTHER PUBLICATIONS

Lehto, I. Superconducting prepolarization coil for ultra-low-field MRI., Dec. 12, 2017, <https://aaltodoc.aalto.fi/handle/123456789/29321>.
International Search Report and Written Opinion for PCT/FI2019/050614 dated Nov. 11, 2019.

* cited by examiner (a) magnetic field (b) magnetization (c) magnetization with added passive turns

PULSABLE SUPERCONDUCTING COIL SETUP FOR MAGNETICALLY SENSITIVE OPERATIONS

CROSS-REFERENCE TO RELATED APPLICATIONS

This application is the 35 U.S.C. § 371 national stage application of PCT Application No. PCT/FI2019/050614, filed Aug. 29, 2019, where the PCT claims priority to, and the benefit of, FINNISH application no. 20185716, filed Aug. 29, 2018, both of which are herein incorporated by reference in their entireties.

TECHNICAL FIELD

The present invention relates to a device with which a magnetically sensitive operation such as a magnetic resonance imaging measurement can be performed for example after preparatory magnetic field pulses.

BACKGROUND

Currently, pulsable fields for prepolarized MRI have been implemented using either normal copper or elemental superconductors in a coil. However, due to various technical difficulties, strong prepolarization pulses have not been achieved without compromising other aspects of the imaging system. Restricted by the system geometry and thermal performance, a copper coil necessarily becomes physically large, inducing problems through transient eddy currents in other parts of the imaging system or its surroundings. Furthermore, thick normal conductors capable of carrying large currents introduce measurement error in the form of thermal magnetic noise. A polarization coil made of niobium-based wire has been successfully used, but the low critical fields in elemental superconductors severely limits the attainable field strengths.

Instead, operating Type-II superconducting materials allows strong fields to be produced in a state where superconducting vortices form in the bulk of the conductor. However, these vortices being trapped in the material leads to intrinsically strong magnetization behaviour. Because of the resulting magnetic field distortions, type-II superconductors have been considered unsuitable for the purpose. For other types of coils in various applications, shimming techniques have been developed to control field distortions arising in coils for different applications. However, the problem of remanent field induced by magnetized Type-II superconductors in rapidly pulsable coils has been lacking an applicable solution.

Affected by current driven through the coil, the system of trapped vortices in the superconductor exhibits complex hysteretic dynamics that may involve also the effects of temperature changes due to energy from the changing current in the coil dissipated into the coil material.

SUMMARY

The following presents a simplified summary in order to provide basic understanding of some aspects of various invention embodiments. The summary is not an extensive overview of the invention. It is neither intended to identify key or critical elements of the invention nor to delineate the scope of the invention. The following summary merely presents some concepts of the invention in a simplified form as a prelude to a more detailed description of exemplifying embodiments of the invention.

An object of the invention is to present a device for for magnetic measurements and/or magnetic imaging such as an MRI device or a hybrid MEG-MRI device. The device comprises an array of one or more detectors for the magnetic signal and one or more coils for producing preparatory magnetic field pulses. The device further comprises means to drive current pulses through the said coils, wherein at least one of the coils comprises material that is Type-II superconducting at the operating temperature. The device is configured to cancel out at least part of the field generated by the remanent magnetization after a current pulse by the shape of the current pulse and/or the geometrically balanced design of the coil.

The device of the invention can be used e.g. in MRI-environment, ULF MRI-environment and hybrid MEG and MRI environment.

Another object of the invention is an MRI measurement arrangement, such as a ULF-MRI measurement arrangement or a hybrid MEG and MRI measurement arrangement comprising the above described device.

With the solution of the invention, devices for magnetic measurements and magnetic imaging techniques with rapidly pulsable coils without significant field distortion after the pulsing are provided. To achieve strong pulsed fields, e.g. exceeding 20 mT in the imaging volume, without persistent field distortions, harmful transients and excess thermal magnetic noise, the effects of self-induced superconducting vortices have to be eliminated. This can be done e.g. by shaping the magnetic field over the superconductor in both time and space in a balancing manner.

In one embodiment of the invention Type-II superconducting multifilament wire design is used for low hysteresis. In one embodiment of the invention the Type-II superconducting multifilament wire design is winded in a tightly packed circular shape.

In one embodiment of the invention the cross section of the coil can be made close to circular (e.g. square).

In one embodiment of the invention a chosen proportion of the outer turns (windings) are made passive such that they do not carry the transport current.

In one embodiment of the invention the residual field can be reduced by introducing carefully optimized additional oscillations to the current pulse in order to achieve dynamical waveform coupling to the system of vortices.

Compared to a coil made with normal copper wire, a superconducting coil also eliminates the issues with thermal magnetic noise, and the required cooling is conveniently arranged when the coil can share the same liquid helium bath with e.g. superconducting quantum interference devices (SQUIDs) in an magnetic imaging setup.

The expression "a number of" refers herein to any positive integer starting from one, e.g. to one, two, or three. The expression "a plurality of" refers herein to any positive integer starting from two, e.g. to two, three, or four.

Various exemplifying and non-limiting embodiments of the invention both as to constructions and to methods of operation, together with additional objects and advantages thereof, will be best understood from the following description of specific exemplifying and non-limiting embodiments when read in connection with the accompanying drawings.

The verbs "to comprise" and "to include" are used in this document as open limitations that neither exclude nor require the existence of unrecited features. The features recited in dependent claims are mutually freely combinable unless otherwise explicitly stated. Furthermore, it is to be understood that the use of "a" or "an", i.e. a singular form, throughout this document does not exclude a plurality.

BRIEF DESCRIPTION OF THE DRAWINGS

The embodiments of the invention are illustrated by way of example, and not by way of limitation, in the figures of the accompanying drawings.

DETAILED DESCRIPTION

The specific examples provided in the description given below should not be construed as limiting the scope and/or the applicability of the appended claims. Lists and groups of examples provided in the description given below are not exhaustive unless otherwise explicitly stated.

Figure 1:
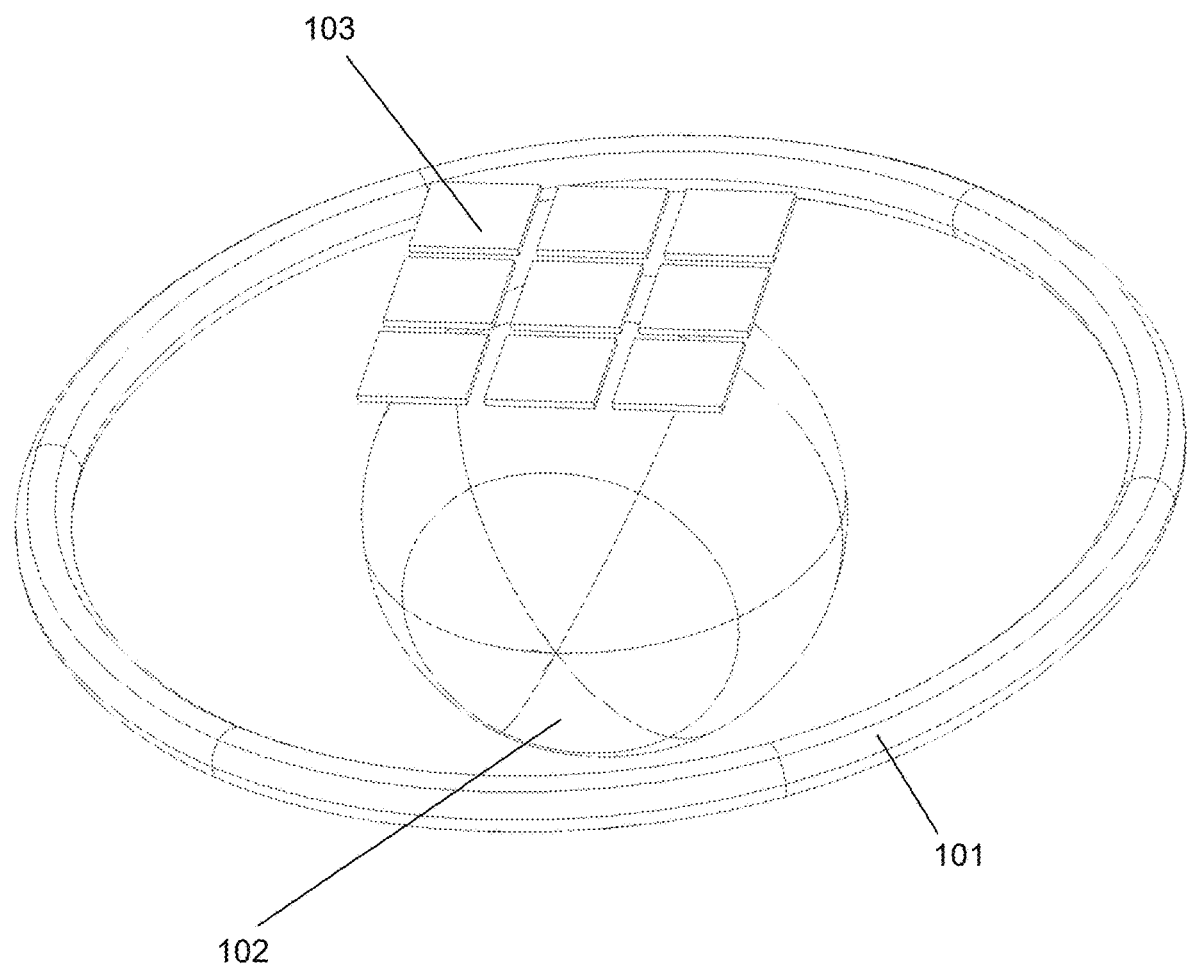
FIG. 1 shows an example embodiment of the invention, with a toroidal coil essentially surrounding a spherical sample and an array of magnetic field sensors.

The geometry of a superconducting coil strongly affects the remanent field produced by the coil magnetized in its self-field. The ability of the hysteretic magnetization to generate remanent field can be minimized e.g. by choosing a circular coil geometry with a compact circular winding cross section, as visualized in FIG. 1 as an example, showing an embodiment of the invention, with a toroidal coil 101 roughly surrounding a spherical sample 102 and an array of magnetic field sensors 103. However, the invention can be incorporated into many different setups, such as MRI devices with additional gradient and excitation coils.

Figure 2:
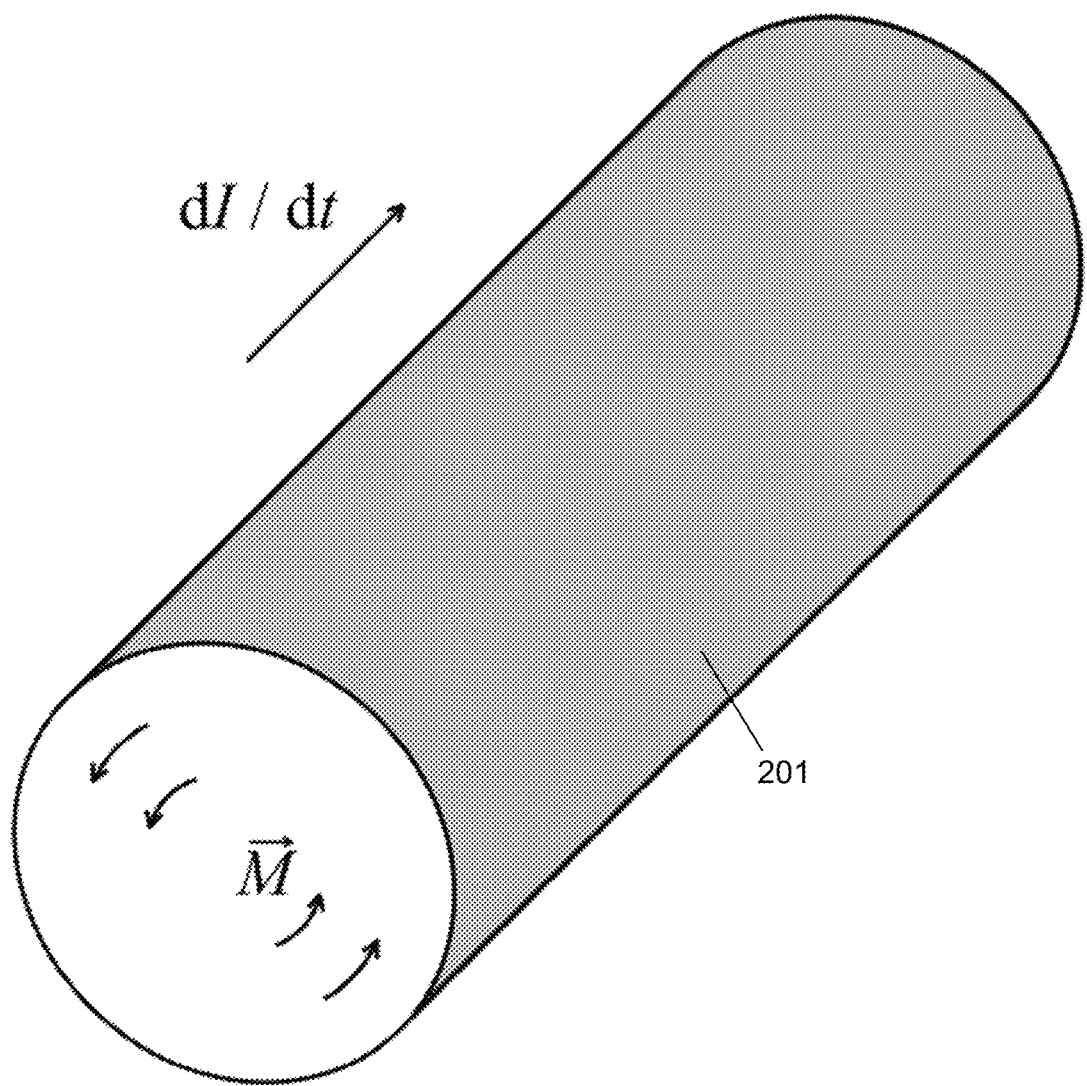
FIG. 2 shows as an illustration the magnetization in a straight circular wire bundle after the total transport current has been ramped down.

The winding cross section can consist of a large number of wire turns. It is possible to use a cross section that differs slightly from circular; for example, a square cross section might be preferred to ease the winding process. To see the motivation for such a design, we can consider a straight, infinitely long bundle of windings with a circular cross section, as shown in FIG. 2 which presents the magnetization in a straight circular wire bundle 201 after the total transport current has been ramped down from a much larger value. This corresponds to a cut-out piece from a circular coil in the large-radius limit. The field produced by this bundle 201 of wire windings, carrying a total transport current I evenly shared by the individual windings, is entirely azimuthal, leading to an equally azimuthal magnetization. Such a magnetization corresponds to a bound surface current and an equal amount of bound volume current in the opposite direction. Due to the symmetry of the wire bundle, these bound currents produce no magnetic field outside the bundle. However, it is clear that such a geometry is not possible with real magnets. But if the winding cross section of a circular or near-circular coil is made small compared to its diameter, the case is approached where the field near the wires is that created by an infinitely long and straight bundle of wire.

Figure 3:
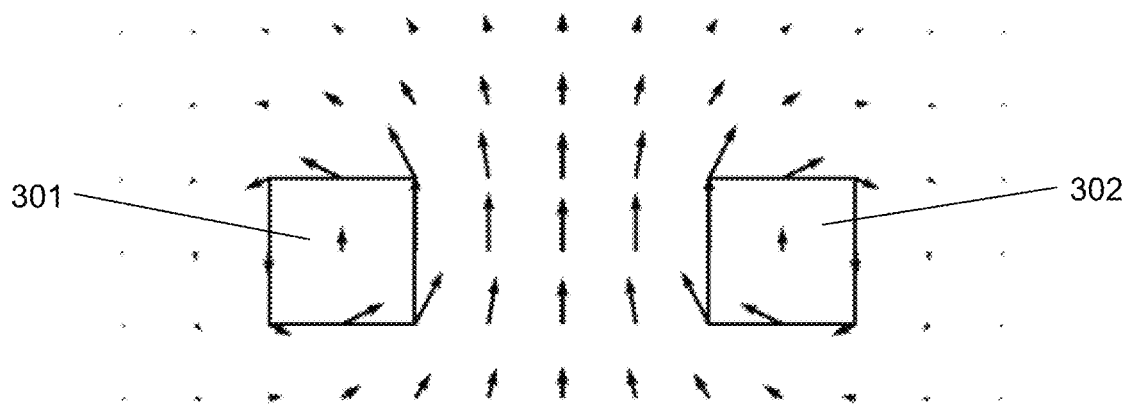
FIG. 3 shows an illustration of the magnetic field produced by the transport current and the saturation magnetization in a coil with a square winding cross section according to an example embodiment of the invention with and without added passive turns.
Figure 3:
Figure 3:

FIGS. 3a-c illustrate the magnetic field produced by the transport current (in FIG. 3a) and the saturation magnetization in a small radius coil with a square winding cross section 301, 302 according to an embodiment of the invention. For a circular coil of a finite radius, there is some remanent field due to the large-radius approximation presented in the previous paragraph. After a strong current pulse, the coil is left magnetized, as illustrated in FIG. 3b as a winding cross section 301, 302. It can be seen that the radial magnetization is anti-symmetric about the mid-plane of the coil, having an equal amount of magnetization in the inward and outward directions. However, in the axial direction such a balance is absent leading to a harmful remanent field pattern within the effective polarizing volume of the coil. This imbalance can be corrected (in space) using additional passive superconducting turns 303, 304. These are turns of superconductor wire that do not carry the transport current fed to the coil, but still exhibit hysteretic magnetization. By correctly placing these passive turns 303, 304, further control of the remanent field can be achieved as illustrated in FIG. 3c. For the case of a compactly wound circular coil (e.g. in FIG. 1), a relatively small number of turns on the outer surface can effectively reduce the remanent field. The amount of superconducting material in the passive turns can be for example equal to the amount in the active turns, preferably under 50%, and most preferably under 20% of the amount of superconducting material in the active turns. For optimal performance, the precise number and placing of the passive turns should be selected such that the remanent field is minimized in the volume of interest. For example, an embodiment may have a coil with 400 active turns and 20 passive turns.

In one embodiment of the invention the passive turns are similar kind of material as the active turns, e.g. Type-II superconducting material. In one embodiment of the invention passive turns are different material than active turns, e.g. any material which can be magnetized, for example Type-II superconducting material or ferro-/ferri-magnetic material. In one embodiment of the invention a part of passive turns are similar kind of material as the active turns and a part of passive turns are different kind of material as the active turns. In one embodiment of the invention the passive turns are substituted with material not in the form of turns of wire, but for example with small pieces of any material that does not carry the transport current and can be magnetized, e.g. ferromagnetic powder. In one embodiment of the invention the device comprises both passive material described above, i.e. passive turns of wire and pieces of material that can be magnetized.

Figure 4:
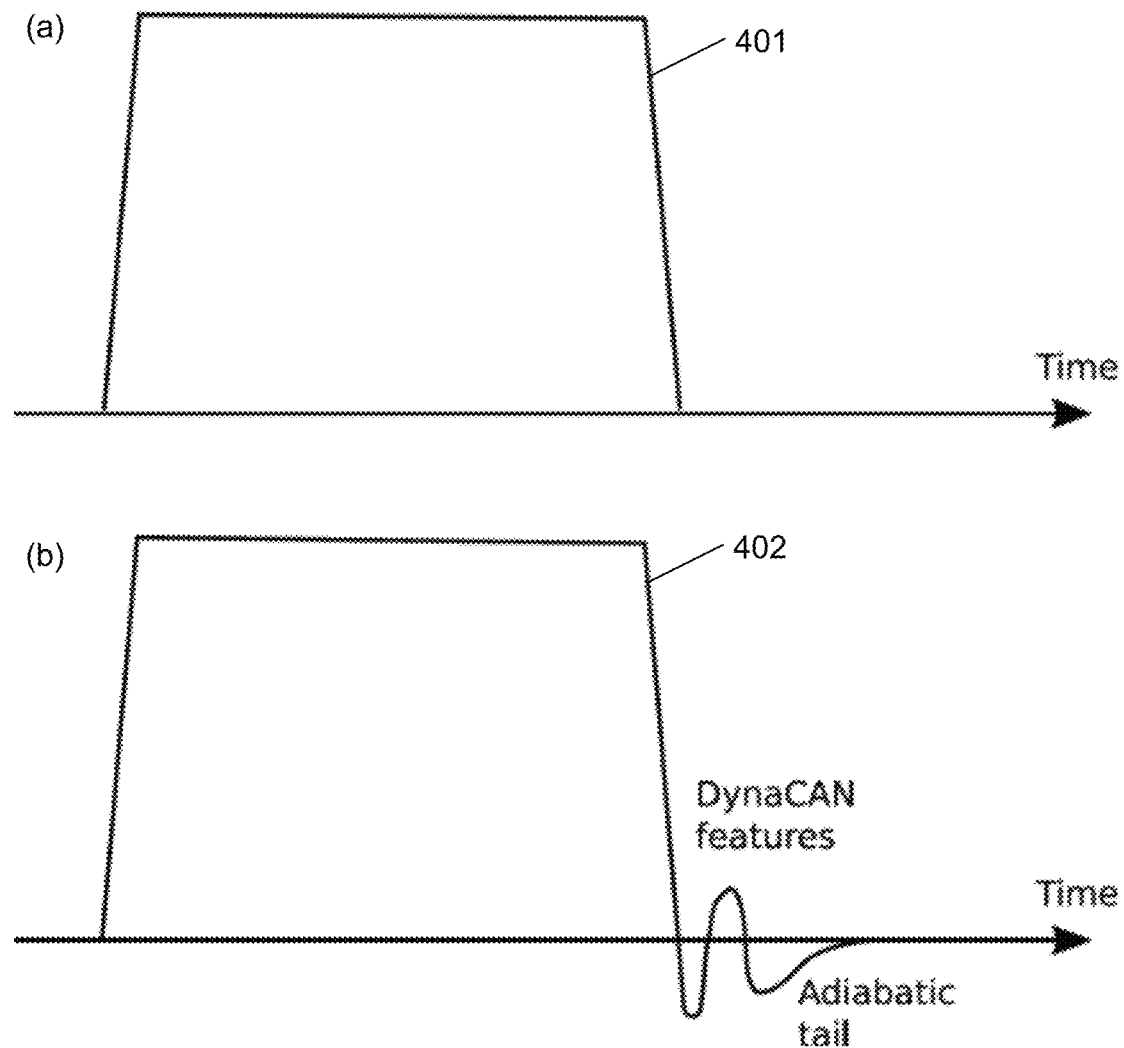
FIG. 4 shows a schematic depiction of electric current fed into the superconducting coil and how the time dimension is used, according to an example embodiment of the invention.

With the above presented measures, it can be possible to find significant reductions in the remanent field. However, these measures do not always sufficiently eliminate the remanent field in large volumes, although this may be sufficient for some types of measurements. To use the time dimension for balancing, dynamical coupling waveforms (also referred to as Dynamical Coupling for Additional dimeNsions, DynaCAN) can be used to suppress the remanent field. Instead of simply applying typical polarizing pulses such as square pulses, embodiments of the invention may utilize alternative waveforms that couple to the complex hysteretic vortex dynamics in such a way that the remanent field is driven towards zero. This can dramatically increase the usable imaging volume in which the field distortions are tolerable. Such waveforms can be found for example by experimental optimization, or by using simulations of the produced remanent field. FIG. 4 shows a schematic depiction of electric current fed into the superconducting coil and how the time dimension can used, according to an embodiment of the invention. One example of such a waveform 402 is illustrated in FIG. 4b, where a square pulse is followed by a short tail with decaying oscillations. As a comparison, FIG. 4a presents a waveform 401 that has not been designed to favourably couple to the complex hysteretic vortex dynamics.

It is advantageous if the duration of the compensation is short, e.g. 10-40 ms or max. 10 ms, the pulse comprising a number of optimized oscillations. This way the remanent field is driven towards zero quickly and the measurement after the current pulse can be started. The exact form of the used pulse waveform relates to material used in the coil and geometry of the coil.

In magnetic resonance measurements, the additional pulse waveform features should be configured not to harmfully affect the nuclear spin dynamics and thereby the magnetic resonance signal. In one embodiment of the invention, the pulse waveform features for reducing the remanent field are fast enough to lead to non-adiabatic spin dynamics. In one embodiment, the pulse waveform ends in additional slower rampdown tail after non-adiabatic pulse waveform features, leading to adiabatic spin dynamics to align the nuclear magnetization with another applied magnetic field.

It is advantageous to choose the structure and materials for the superconducting wire for low AC losses, low remanent field, as well as for allowing sufficient current density and stability. Type-II superconducting wires can consist of a large number of superconductor filaments, e.g. micrometers in diameter, arranged in a normal metal matrix. The maximum magnetization of a filament is proportional to its diameter, and therefore the filament size should be minimized. Unfortunately, very fine filaments are difficult to produce, and when the interfilament separation becomes too small, the filaments can couple, leading to increased magnetization. This limits the minimum filament size practically available. In pulsed operation, there are also significant loss mechanisms in such composite wires. The most important AC loss mechanisms are hysteresis loss, arising from the irreversible magnetization behavior, and coupling loss resulting from ohmic dissipation in interfilament currents crossing the normal matrix. Using fine filaments effectively reduces the hysteresis losses. To reduce the coupling losses to tolerable levels, a carefully designed normal metal matrix can be used for impeding the interfilament currents. For example, such a design could employ hundreds or thousands of niobium-titanium filaments, e.g. micrometers in diameter, embedded in a resistive cupronickel matrix and tightly twisted to reduce the interfilament currents. In one embodiment, e.g. some pure copper can be added in the wire core or as an outer jacket to improve stability. In one example embodiment, 0.44 mm diameter insulated wire with 630 niobium-titanium filaments of 12 μm diameter in a composite copper-cupronickel matrix is used.

In one embodiment of the invention, the coil is wound around a coil former, e.g. from fiberglass or cotton reinforced phenolic, and impregnated with a resin, e.g. epoxy-based resin, to improve the heat conduction within the coil, and to prevent wire motion due to electromagnetic forces. Special attention should be paid to ensuring that the cooling is sufficient, since the losses in pulsed operation can be significant depending on the type of wire used and on the pulse shape. Also, a certain level of precision in the winding process is necessary to achieve a symmetrical coil with a good wire packing density.

Different embodiments may rely on spatial and temporal balancing to different degrees. On the one hand, fairly non-circular and magnetically imbalanced wire bundle cross section may be sufficient if the temporal axis is used to compensate for the imbalance. On the other hand, with a spatially well balanced coil, using DynaCAN waveforms may be unnecessary.

One embodiment of the invention relates to a device for magnetic measurements or magnetic imaging, the device having an array of one or more detectors for the magnetic signal and one or more coils for producing preparatory magnetic field pulses.

In one embodiment of the invention the device further has means to drive current pulses through the said coils.

In one embodiment of the invention at least one of the coils contains material that is Type-II superconducting at the operating temperature.

In one embodiment of the invention at least one of the coils (e.g. each coil) has windings in a circular or near-circular shape, forming a bundle of windings with a compact cross section that is also circular or close to circular (e.g. square), reducing the remanent field produced by the coils after applied current pulses.

In one embodiment of the invention the coils comprise passive superconducting windings that do not carry the driven current, to further reduce the magnetic field produced by the coils after applied current pulses. In one embodiment of the invention the amount of superconducting material in the passive windings is up to 100% of the superconducting material in the active windings. In one embodiment of the invention the amount of superconducting material in the passive windings is up to 50% of the superconducting material in the active windings. In one embodiment of the invention the amount of superconducting material in the passive windings is up to 20% of the superconducting material in the active windings.

In one embodiment of the invention the current driven into the coils has additional features, such as oscillations, in the waveform, exploiting the application-specific freedom in the pulse shape to couple into the hysteretic vortex dynamics in the Type-II superconductor, allowing further control of the remanent field, and therefore further reduction of the field produced by the coil after current pulses.

In one embodiment of the invention the remanent field is reduced by a factor of at least 5 using oscillations at the end of the current pulse. In one embodiment of the invention the remanent field is at least 5 orders of magnitude smaller than the field produced during application of the current.

The specific examples provided in the description given above should not be construed as limiting the applicability and/or the interpretation of the appended claims. Lists and groups of examples provided in the description given above are not exhaustive unless otherwise explicitly stated.

The invention claimed is:

1. A device for magnetic measurements and/or magnetic imaging, characterized in that the device comprises an array of one or more detectors for a magnetic signal and one or more coils for producing preparatory magnetic field pulses, wherein current pulses are driven through the coils, and wherein at least one of the coils comprises material that is a Type-II superconductor at operating temperature, wherein the device is configured to cancel out at least part of the field generated by remanent magnetization after a current pulse by the shape of the current pulse and/or the geometrically balanced design of the coil, wherein the current driven into the one or more coils is configured to couple into the hysteretic vortex dynamics of the Type-II superconductor in such a way that remanent field produced by the coil after the current pulses is driven towards zero.

2. A device according to claim 1, characterized in that the device is configured to cancel out essentially all of the field generated by the remanent magnetization after a current pulse.

3. A device according to claim 1, characterized in that geometrically balanced design of the coil comprises windings in essentially circular shape wherein the cross section of the coil is essentially circular or square-shaped.

4. A device according to claim 1, characterized in that the at least one coil comprises Type-II superconducting wire having diameter smaller than 5 mm.

5. A device according to claim 4, characterized in that one Type-II superconducting wire comprises from hundreds to hundreds of thousands of superconductor filaments having diameter smaller than 100 µm.

6. A device according to claim 1, characterized in that the at least one coil comprises from tens to thousands of turns of Type-II superconducting wire, e.g. niobium-titanium based superconductor wire.

7. A device according to claim 1, characterized in that the geometrically balanced design of the at least one coil comprises passive windings that are configured to not carry the driven current, wherein the passive windings are arranged e.g. essentially next to the outer active windings.

8. A device according to claim 7, characterized in that the passive windings comprise a superconducting material at the operating temperature.

9. A device according to claim 7, characterized in that the amount of superconducting material in the passive windings is up to 100% of the superconducting material in the active windings.

10. The device according to claim 8, wherein the superconducting material is a Type II superconducting material.

11. A device according to claim 1, characterized in that the device comprises pieces of material that can be magnetized and don't carry the transport current, wherein the material is arranged in connection with the coil and being ferromagnetic powder.

12. A device according to claim 1, characterized in that current configured to couple into the hysteretic vortex dynamics of the Type-II superconductor comprises a predefined number of decaying oscillations, the duration of the oscillations being in the range of shorter than 40 ms.

13. The device according to claim 12, wherein the duration of the oscillations is in the range of 10-40 ms.

14. The device according to claim 12, wherein the duration of the oscillations is shorter than 10 ms.

15. A device according to claim 1, characterized in that the current pulse features configured to couple into the hysteretic vortex dynamics of the Type-II superconductor leads to non-adiabatic nuclear spin dynamics regarding a magnetic resonance measurement.

16. A device according to claim 1, characterized in that the end of the current pulse waveform configured to couple into the hysteretic vortex dynamics of the Type-II superconductor comprises a rampdown tail that leads to adiabatic nuclear spin dynamics regarding a magnetic resonance measurement.

17. An MRI measurement arrangement, such as a ULF-MRI measurement arrangement, or a hybrid MEG and MRI measurement arrangement characterized in that the arrangement comprises a device according to claim 1.

* * * * *